(12) United States Patent
Kang

(10) Patent No.: US 7,130,211 B2
(45) Date of Patent: Oct. 31, 2006

(54) INTERLEAVE CONTROL DEVICE USING NONVOLATILE FERROELECTRIC MEMORY

(75) Inventor: Hee Bok Kang, Daejeon (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 10/629,673

(22) Filed: Jul. 30, 2003

(65) Prior Publication Data

US 2004/0125641 A1    Jul. 1, 2004

(30) Foreign Application Priority Data

Dec. 27, 2002    (KR) ................ 10-2002-0085533

(51) Int. Cl.
  *G11C 11/22*    (2006.01)
(52) U.S. Cl. ................ 365/145; 365/189.12; 711/157
(58) Field of Classification Search ............ 365/145 O, 365/189.12 X; 711/157 X
  See application file for complete search history.

(56) References Cited

U.S. PATENT DOCUMENTS

| 5,668,974 A | * | 9/1997 | Grassi et al. ............... 711/157 |
| 6,104,668 A | | 8/2000 | Lee et al. |
| 6,108,745 A | * | 8/2000 | Gupta et al. ................ 711/3 |
| 6,266,285 B1 | | 7/2001 | Farmwald et al. |
| 6,272,594 B1 | | 8/2001 | Gupta et al. |
| 6,288,930 B1 | * | 9/2001 | Takeshima et al. ......... 365/145 |
| 6,314,051 B1 | | 11/2001 | Farmwald et al. |
| 6,363,439 B1 | | 3/2002 | Battles et al. |
| 6,405,286 B1 | * | 6/2002 | Gupta et al. ............... 711/127 |
| 2004/0093457 A1 | * | 5/2004 | Heap ............................ 711/5 |
| 2004/0210729 A1 | * | 10/2004 | Horri et al. ................. 711/156 |

* cited by examiner

*Primary Examiner*—VanThu Nguyen
(74) *Attorney, Agent, or Firm*—Heller Ehrman LLP

(57) ABSTRACT

An interleave control device using a nonvolatile ferroelectric memory is disclosed. More specifically, a memory interleave structure using a nonvolatile ferroelectric register configured to individually control interleaves of banks is disclosed. In an embodiment of the present invention, interleaves of each bank can be individually controlled using a single nonvolatile ferroelectric memory chip, a multi-bank nonvolatile ferroelectric memory chip or a multi-bank interleave nonvolatile ferroelectric memory chip.

7 Claims, 21 Drawing Sheets

INTERLEAVE CONTROL DEVICE USING NONVOLATILE FERROELECTRIC MEMORY

BACKGROUND OF THE INVENTION

1. Field of the Invention

The present invention relates to an interleave control device using a nonvolatile ferroelectric memory, and more specifically, to an interleave control device configured to control interleaves of each bank individually in a signal FeRAM chip, a multi-bank FeRAM chip or a multi-bank interleave FeRAM chip, thereby reducing a row access latency.

2. Description of the Prior Art

Generally, a ferroelectric randaom access memory (hereinafter, referred to as 'FeRAM') has attracted considerable attention as next generation memory device because it has a data processing speed as fast as a Dynamic Random Access Memory DRAM and conserves data even after the power is turned off.

The FeRAM having structures similar to the DRAM includes the capacitors made of a ferroelectric substance, so that it utilizes the characteristic of a high residual polarization of the ferroelectric substance in which data is not low even after eliminating an electric field applied thereto.

FIG. 1 is a characteristic curve illustrating a hysteresis loop of a general ferroelectric substance.

A polarization induced by an electric field does not vanish but remains at a certain portion ('d' or 'a' state) even after the electric field is cleared due to existence of a residual (or spontaneous) polarization. The FeRAM cell is used as a memory device by corresponding the 'd' and 'a' states to binary values of '1' and '0', respectively.

FIG. 2 is a structural diagram illustrating a unit cell of the conventional FeRAM device.

The unit cell of the conventional FeRAM is provided with a bitline BL arranged in one direction and a wordline WL arranged in another direction vertical to the bitline BL. A plateline PL is arranged parallel to the wordline WL and spaced at a predetermined interval.

The unit cell is also provided with a transistor T1 having a gate connected to an adjacent wordline WL and a source connected to an adjacent bitline BL. A drain of the transistor T1 is connected to one terminal of a ferroelectric capacitor FC0. The other terminal of the ferroelectric capacitor FC0 is connected to the plateline PL.

The data input/output operation of the conventional FeRAM is now described referring to FIGS. 3a and 3b.

FIG. 3a is a timing diagram illustrating a write mode of the conventional FeRAM.

At an active period, a chip enable signal CSB applied externally transits from a high to low level. If a write enable signal WEB simultaneously transits from a high to low level, the array is enabled to start a write mode. Thereafter, when an address is decoded in the write mode, a pulse applied to a corresponding wordline transits from a low to high level, thereby selecting the cell.

In the interval where the wordline WL is held at a high level, a high signal of a predetermined interval and a low signal of a predetermined signal are sequentially applied to a corresponding plateline PL. In order to write binary logic values '1' or '0' in the selected cell, 'high' or 'low' signals synchronized in the write enable signal are applied to a corresponding bitline BL. Here, a sense amplifier enable signal SEN is maintained at a high level.

In other words, when a high signal is applied to a bitline BL and a low signal is applied to a plateline PL, a logic value "1" is written as input data DIN in the ferroelectric capacitor FC0. When a low signal is applied to a bitline BL and a high signal is applied to a plateline PL, a logic value "0" is written as input data DIN in the ferroelectric capacitor FC0.

FIG. 3b is a timing diagram illustrating a read mode of the FeRAM.

At an active period, a chip enable signal CSB externally transits from a high to low level. All bitlines BL are equalized to a low level by an equalization signal before selection of a required wordline WL.

After each bitline BL is inactivated and an address is decoded, the required wordline WL depending on the decoded address is transited from a low to high level by the decoded address, thereby selecting a corresponding unit cell. A high signal is applied to a plateline PL of the selected cell to destroy data Qs corresponding to the logic value "1" stored in the FeRAM.

If the logic value "0" is stored in the FeRAM, its corresponding data Qns will not be destroyed. In this way, the destroyed and non-destroyed data output different values, respectively, according to the above-described hysteresis loop characteristics.

In other words, as shown in the hysteresis loop of FIG. 1, the state moves from the 'd' to 'f' when the data is destroyed while the state moves from 'a' to 'f' when the data is not destroyed. As a result, the sense amplifier is enabled by the sense amplifier enable signal SEN after the lapse of a predetermined time. When the data is destroyed, the sense amplifier outputs a logic value "1" as output data DOUT. However, when the data is not destroyed, the sense amplifier outputs a logic value "0" as output data DOUT.

After the sense amplifier amplifies the data, the data should be recovered into the original data. Accordingly, the plateline PL is inactivated from a high to low level at the state whereby a 'high' signal is applied to the required wordline WL.

FIG. 4 is a blcok diagram illustrating a conventional unit memory bank including a nonvolatile ferroelectric memory.

The conventional unit memory bank comprises a row selection unit 1, a column selection unit 2, a cell array block 3, a sense amplifier page buffer unit 4 and a data I/O buffer 5.

The row selection unit 1 selects a corresponding row address of inputted row addresses to output the selected row address. The cell array block 3 activates a row by a corresponding row address applied from the row selection unit 1. Data corresponding to the selected row address is outputted into the sense amplifier page buffer unit 4, and then amplified and stored therein.

The column selection unit 2 selects a corresponding column address among inputted column addresses to output the selected address into the sense amplifier page buffer unit 4. The sense amplifier page buffer unit 4 outputs data having a byte or a word width out of data stored when a corresponding column address is activated into the data I/O buffer 5. The data I/O buffer 5 buffers data from the sense amplifier page buffer unit 4.

Since a column address is a page address in the conventional unit memory bank, an extra sensing process is not required to access data. The data stored in the sense amplifier page buffer unit 4 is outputted without being sensed.

A row address further senses and amplifies data stored in a cell when data is accessed, and maintains data in a sense amplifier. Since a restore time (precharge time) is added to a row access time when data is accessed between row addresses, a longer access time is required. As a result, a row address requires a relatively longer data access time than a column address.

In the conventional unit memory bank, however, since the access time is ineffectively controlled regardless of kinds of addresses when data is accessed, the reliability of memory chips is degraded.

As a result, a device configured to perform an interleave operation using the above-described nonvolatile ferroelectric memory has been much required to reduce an unnecessary data access time and preserve stored program data even when power is off.

SUMMARY OF THE INVENTION

Accordingly, it is an object of the present invention to provide an interleave control device using a nonvolatile ferroelectric memory in order to perform an interleave program in a single chip, a multi-bank chip or a multi-bank interleave chip, thereby reducing a system access latency due to a row access time and a restore time.

In an embodiment of the present invention, there is provided an interleave control device using a nonvolatile ferroelectric memory, comprising a single chip FeRAM array, a memory interleave controller and a bus. The single chip FeRAM array includes a plurality of single banks. The memory interleave controller programs a code for controlling a memory interleave, and changes an address path of the single chip FeRAM array depending on the programmed code. The bus transfers data between the single chip FeRAM array and the memory interleave controller.

There is also provided an interleave control device using a nonvolatile ferroelectric memory, comprising a multi-bank FeRAM array, a memory interleave controller and a bus. The multi-bank FeRAM array includes a plurality of multi-banks. The memory interleave controller programs a code for controlling a memory interleave, and changes an address path of the multi-bank FeRAM array depending on the programmed code. The bus transfers data between the multi-bank FeRAM array and the memory interleave controller.

There is also provided an interleave control device using a nonvolatile ferroelectric memory, comprising a multi-bank interleave FeRAM array, a memory controller and a bus. The multi-bank interleave FeRAM array includes a plurality of multi-bank interleaves wherein each multi-bank interleave including a nonvolatile ferroelectric memory programs a code for controlling a memory interleave and changes an address path depending on the programmed code. The memory controller selectively controls data/a control signal/an address of the multi-bank interleave FeRAM array in response to a memory control signal. The bus transfers data between the multi-bank interleave FeRAM array and the memory controller.

There is also provided an interleave control device using a nonvolatile ferroelectric memory, comprising a nonvolatile interleave program register and an interleave controller. The nonvolatile interleave program register programs a code for controlling an interleave in response to inputted data/a control signal/an address. The interleave controller outputs a control signal for changing an address path of a memory chip array including a plurality of banks depending on the programmed code by the nonvolatile interleave program register.

DETAILED DESCRIPTION OF THE PREFERRED EMBODIMENTS

The present invention will be described in detail with reference to the attached drawings.

Figure 1:
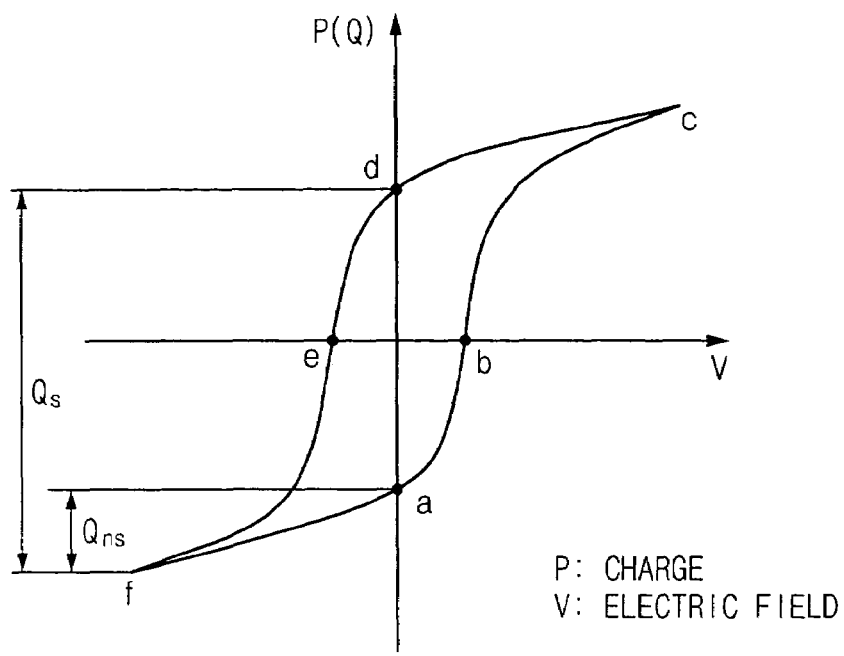
FIG. 1 is a characteristic curve illustrating a hysteresis loop of a general ferroelectric substance.
Figure 2:
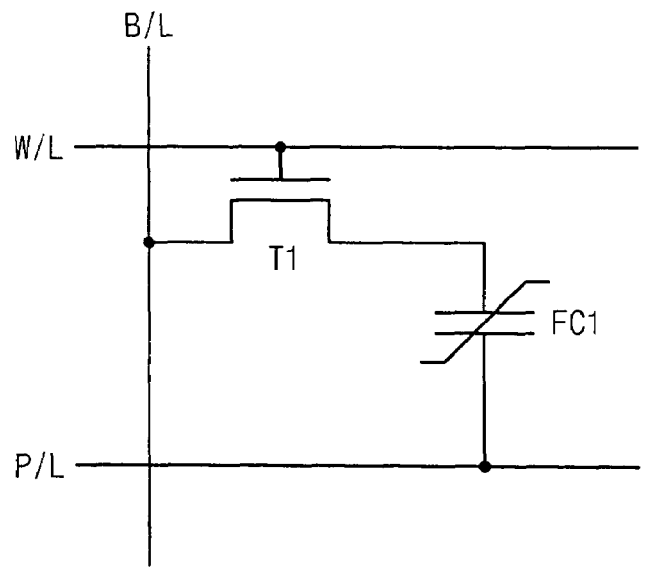
FIG. 2 is a structural diagram illustrating a unit cell in a conventional nonvolatile ferroelectric memory device.
Figure 3A:
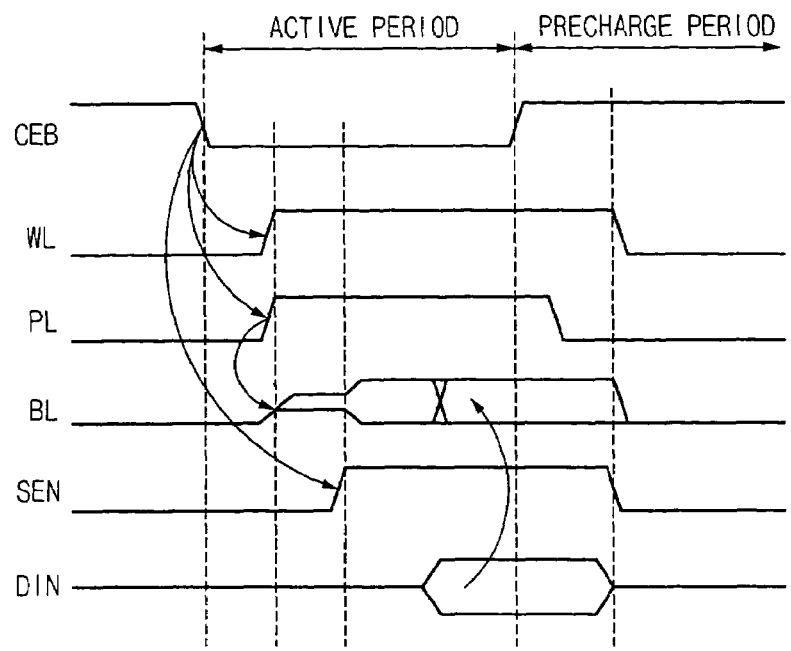
FIG. 3a is a timing diagram illustrating a write mode operation of the conventional nonvolatile ferroelectric memory device.
Figure 3B:
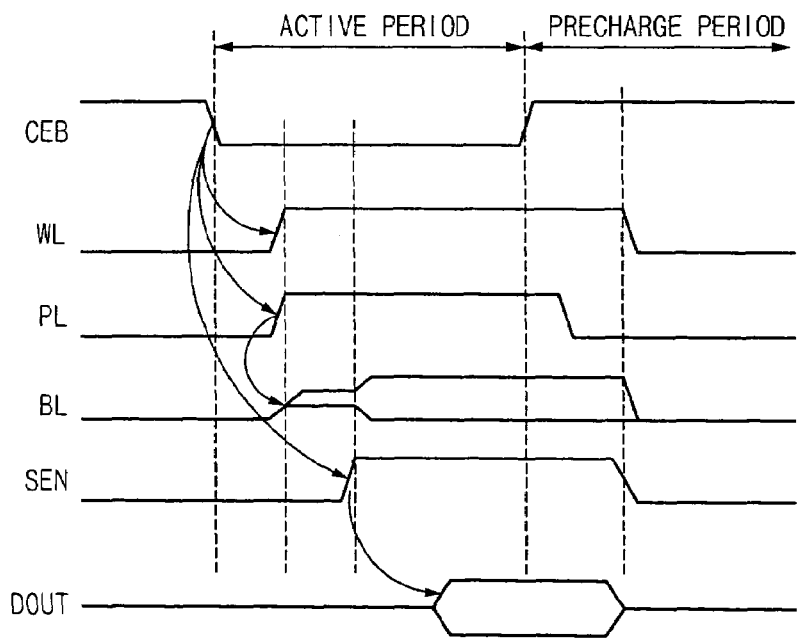
FIG. 3b is a timing diagram illustrating a read mode operation of the conventional nonvolatile ferroelectric memory device.
Figure 4:
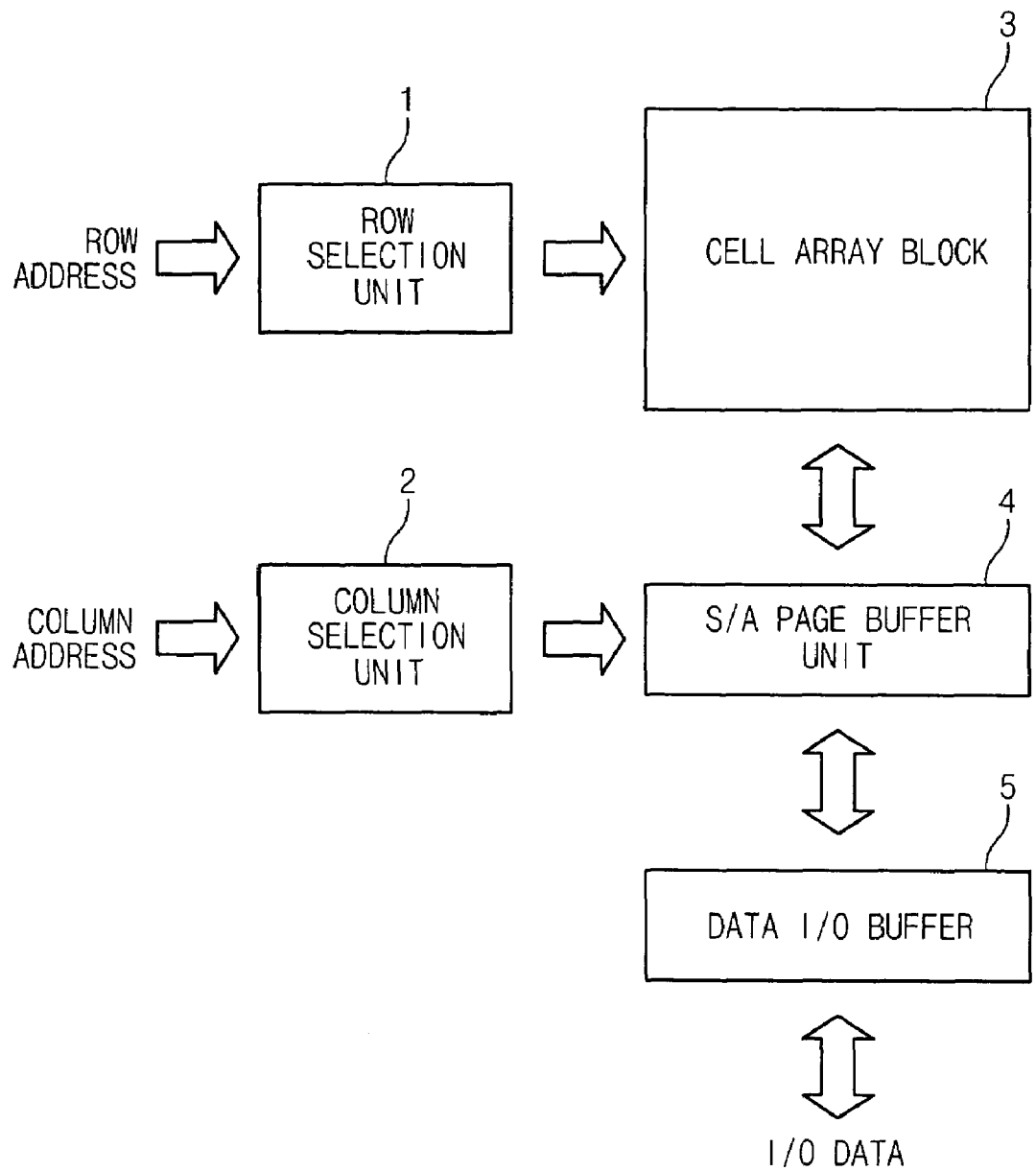
FIG. 4 is a block diagram illustrating a conventional unit memory bank.
Figure 5:
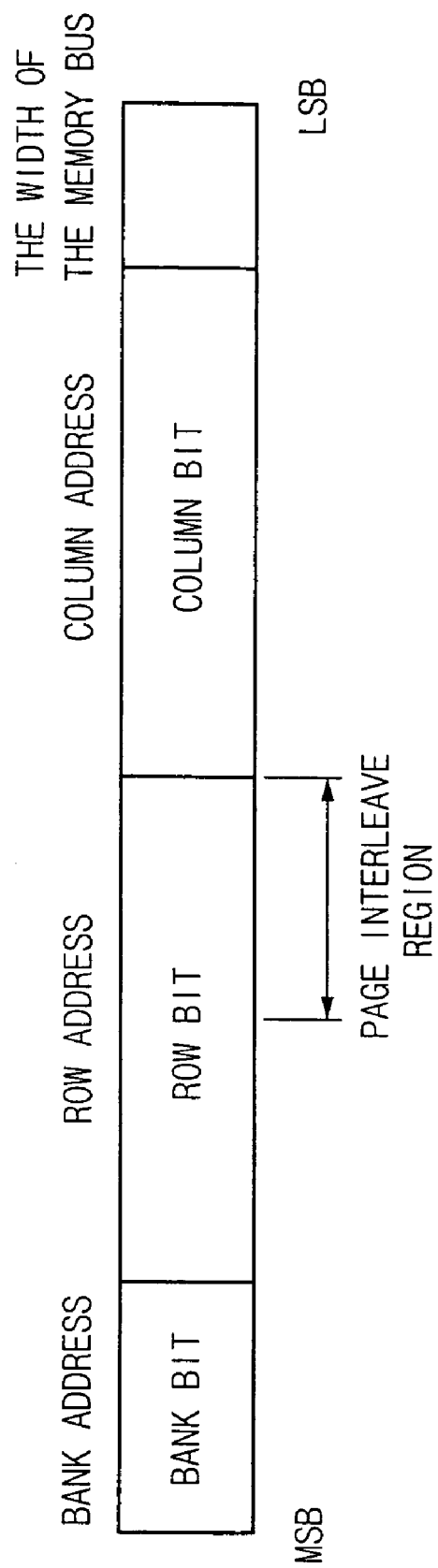
FIG. 5 is a block diagram illustrating the concept of an interleave control device using a nonvolatile ferroelectric memory according to an embodiment of the present invention.

FIG. 5 is a block diagram illustrating the concept of an interleave control device using a nonvolatile ferroelectric memory according to an embodiment of the present invention.

There are memory bus bits in a least significant bit (LSB) region of address. The width of the memory bus bits is one of 32 bit, 16 bit, 8 bit or 4 bit.

Column address bits are disposed between a row address region and a memory bus region. On byte data in a page depending on the column address bits are loaded into a data bus.

There are row address bits in a row address region. Lower address bits of row address bits are used in a memory interleave range. Bank address bits are disposed in a most significant bit (MSB) region.

Figure 6:
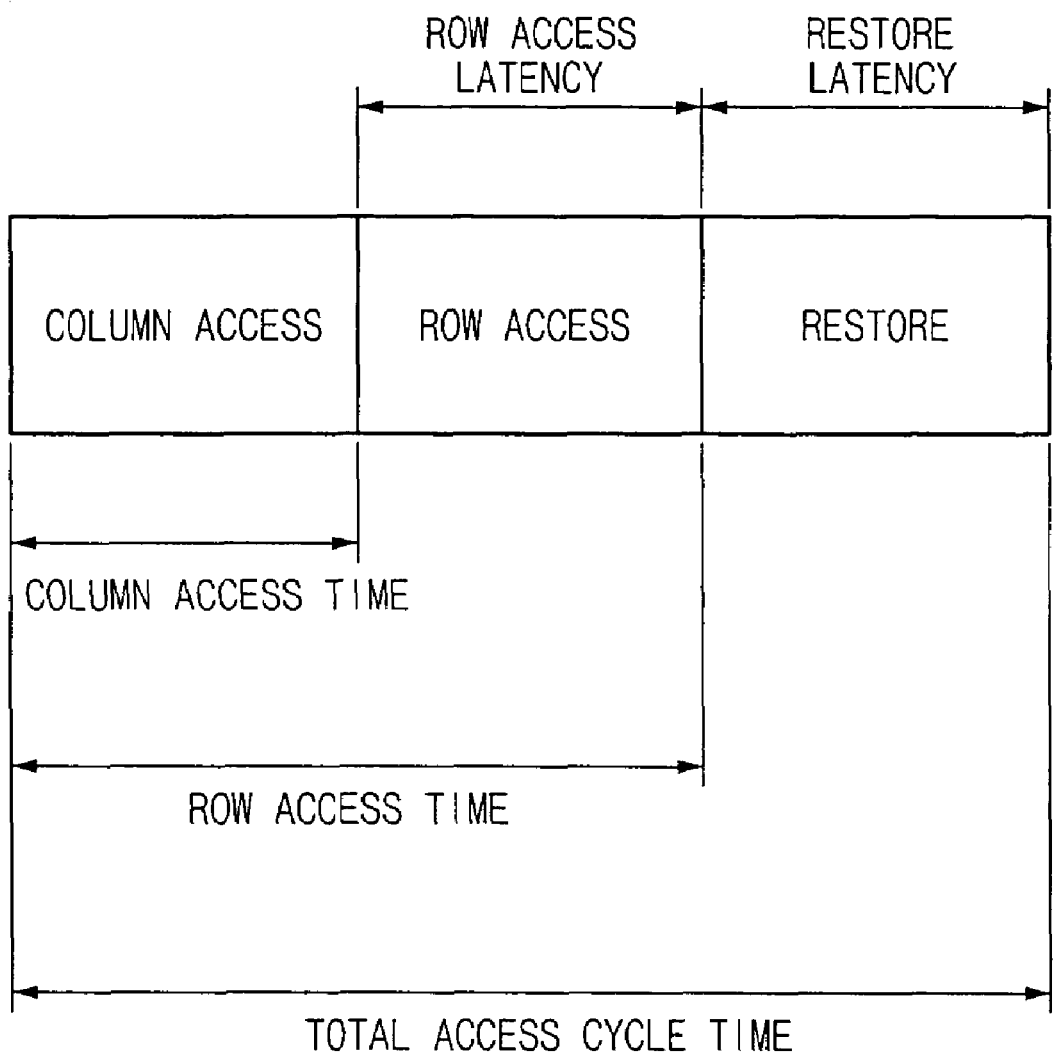
FIG. 6 is a block diagram illustrating the access time of the interleave control device using a nonvolatile ferroelectric memory according to an embodiment of the present invention.

FIG. 6 is a block diagram illustrating the access time depending on kinds of address in a memory chip according to an embodiment of the present invention.

When a column address is accessed, the shortest column access time is required because data stored in a sense amplifier page buffer can be immediately outputted. However, when a row address is accessed, more time (row access latency) is required because the operation of sensing and amplifying data of a memory cell is accompanied.

If an operation cycle of memory is intended to be finished when a row address is accessed, cell data destroyed in the memory cell sensing process should be restored. As a result, a restore latency time is further required to restore cell data. The time is called a precharge time.

First, a row access time is required to access a row address. When a column address is changed in the same row address, a column access time is additionally required.

When a next row address is changed after column addresses corresponding to one row address are all accessed, a restore latency time and a new row access time are required. As a result, the whole access cycle time is required to perform an access on column access, row access and restore intervals.

Accordingly, in an embodiment of the present invention, an interleave operation of each bank is individually controlled depending on kinds of addresses to reduce a row access latency time and a restore latency time.

Figure 7:
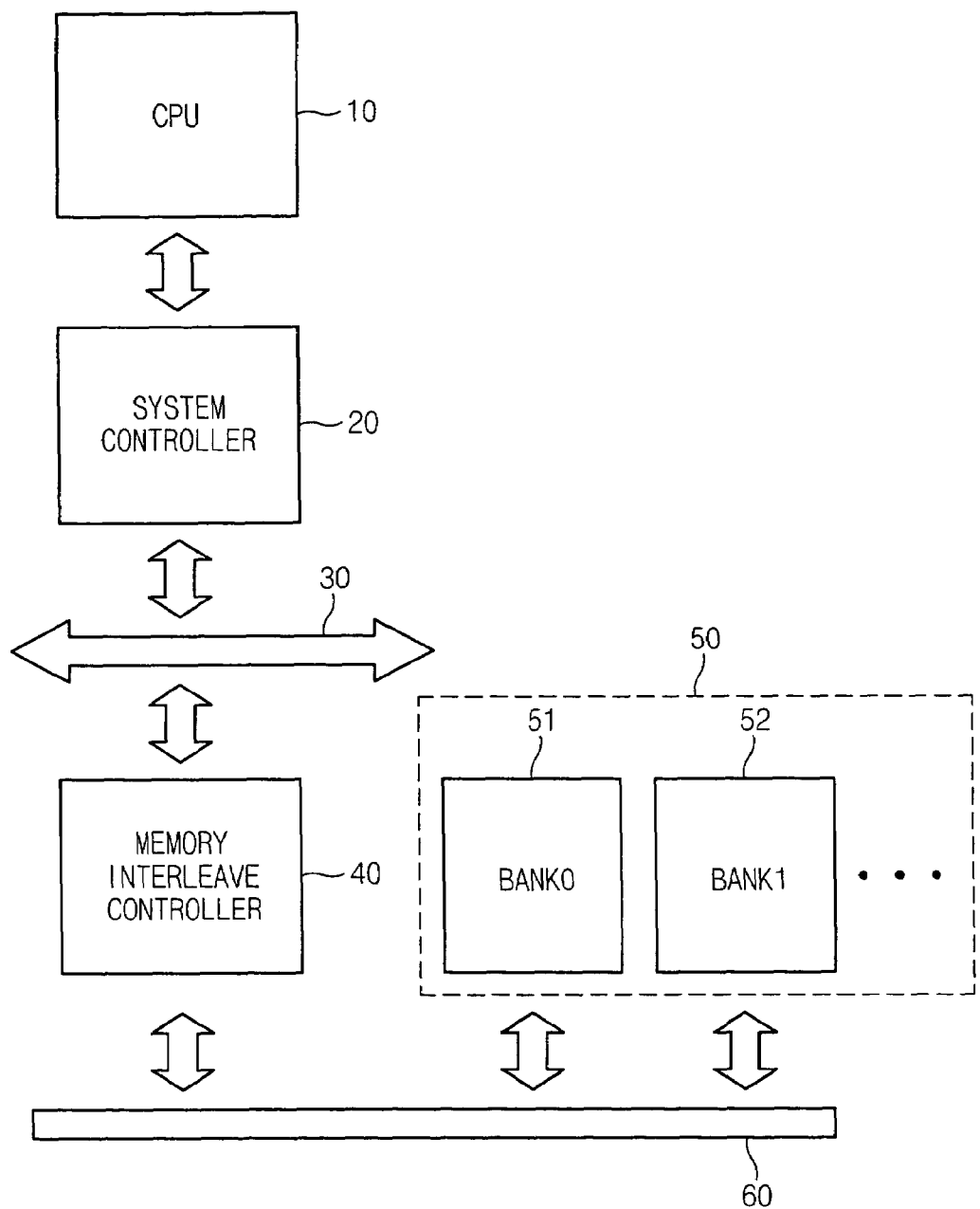
FIGS. 7 and 8 are structural diagrams illustrating the interleave control device using a nonvolatile ferroelectric memory according to an embodiment of the present invention.

FIG. 7 is a structural diagram illustrating an interleave control device using a nonvolatile ferroelectric memory according to an embodiment of the present invention.

The interleave control device comprises a CPU (central processing unit) 10, a system controller 20, a PCI (peripheral component interface) bus 30, a memory interleave controller 40, a single chip FeRAM array 50 and a bus 60. The single chip FeRAM array 50 includes a plurality of unit banks 51 and 52.

The CPU 10 connected to the system controller 20 controls operations necessary for system operation. Data between the system controller 20 and the memory interleave controller 40 is transferred via the PCI bus 30. The memory interleave controller 40 exchanges data with the plurality of unit banks 51 and 52 in the single chip FeRAM array 50 via the bus 60.

Figure 8:
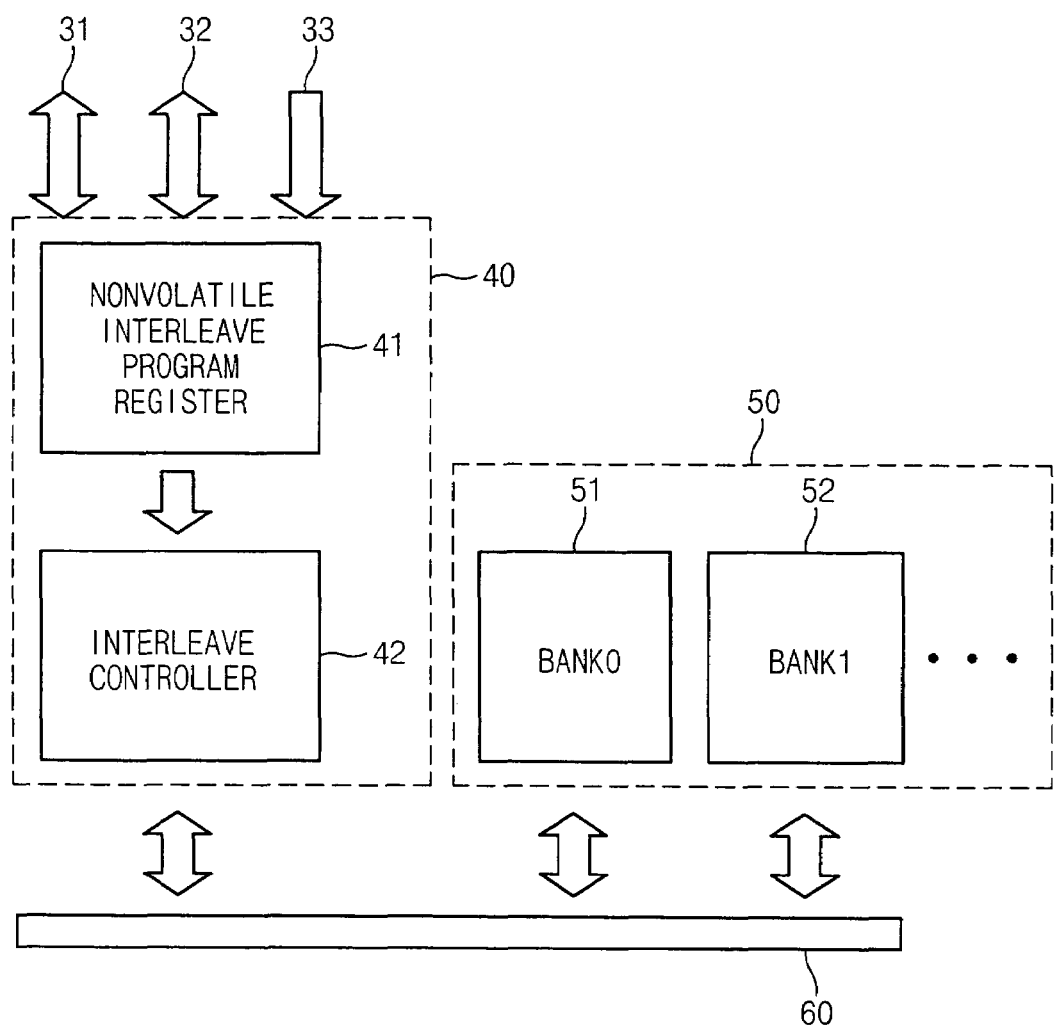

FIG. 8 is a detailed structural diagram illustrating the memory interleave controller 40 of FIG. 7.

The memory interleave controller 40 comprises a nonvolatile interleave program register 41 and an interleave controller 42. The memory interleave controller 40 exchange data with the system controller 20 via a data bus 31, a control bus 32 and an address bus 33.

The nonvolatile interleave program register 41 programs a code for controlling an interleave using a nonvolatile ferroelectric memory. The interleave controller 42 changes an address path of the single chip FeRAM array 50 depending on the programmed code by the nonvolatile interleave program register 41.

Figure 9:
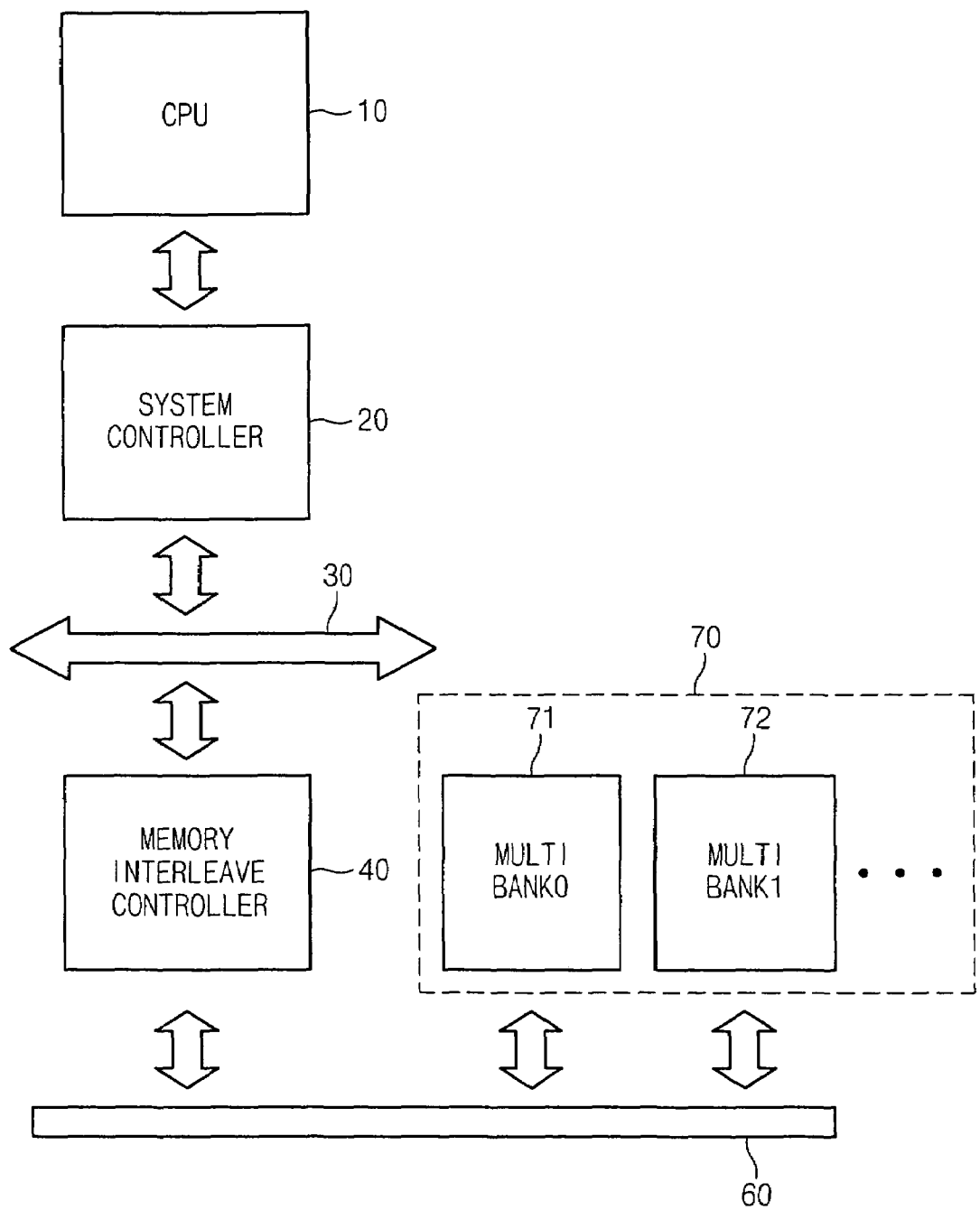
FIGS. 9 to 14 are diagrams illustrating an interleave control device using a nonvolatile ferroelectric memory according to another embodiments of the present invention.

FIG. 9 is another example of an interleave control device using a nonvolatile ferroelectric memory according to an embodiment of the present invention.

The interleave control device of FIG. 9 has the same structure as that of FIG. 7 except that that of FIG. 9 comprises a multi-bank FeRAM array 70 instead of the single chip FeRAM array 50 of FIG. 7.

The multi-bank FeRAM array 70 includes a plurality of multi-banks 71 and 72. Each multi-bank 71 and 72 is an individual memory region configured to operate individually. The multi-bank FeRAM array 70 exchanges addresses/data/control signals with a memory interleave controller 40 via the bus 60.

Figure 10:
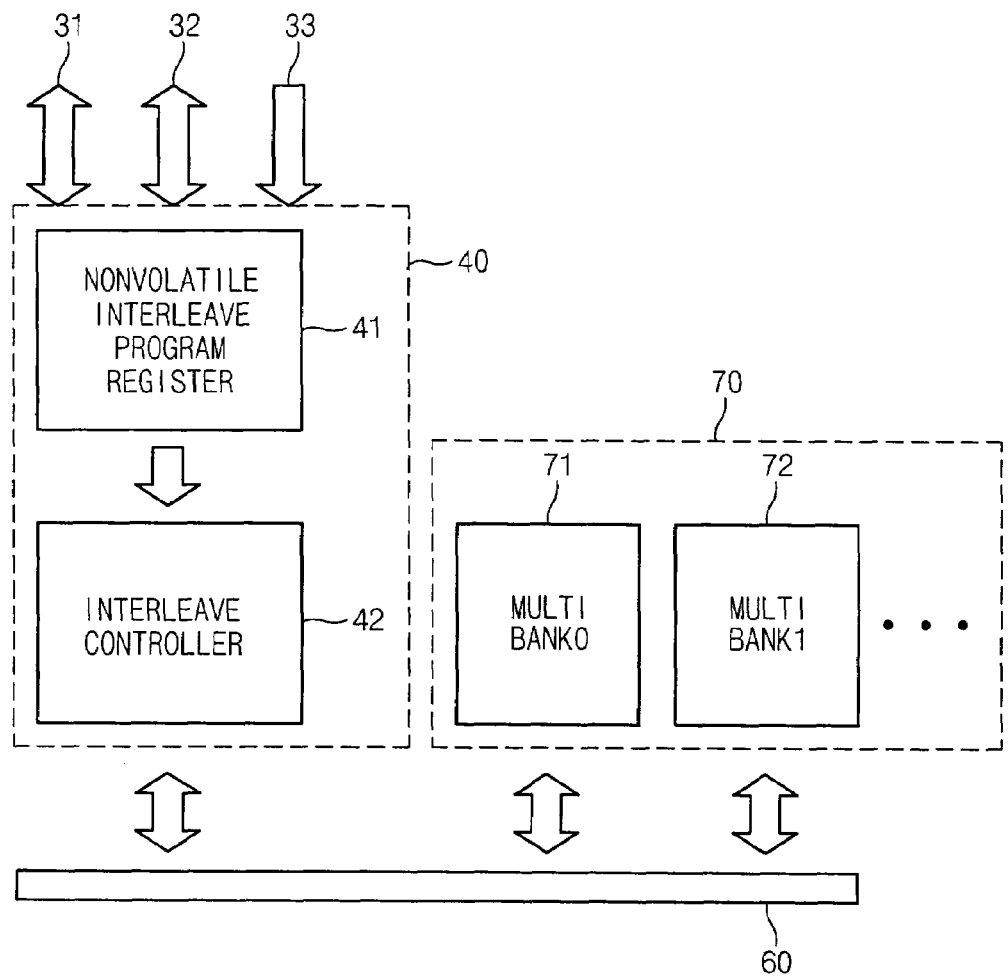

FIG. 10 is a detailed structural diagram illustrating the memory interleave controller 40 of FIG. 9.

The memory interleave controller 40 comprises a nonvolatile interleave program register 41 and an interleave controller 42. The memory interleave controller 40 exchanges data with a system controller 20 via a data bus 31, a control bus 32 and an address bus 33.

The nonvolatile interleave program register 41 programs a code for controlling an interleave using a nonvolatile ferroelectric memory. The interleave controller 42 changes an address path of the multi-bank FeRAM array 70 depending on the programmed code by the nonvolatile interleave program register 41.

Figure 11:
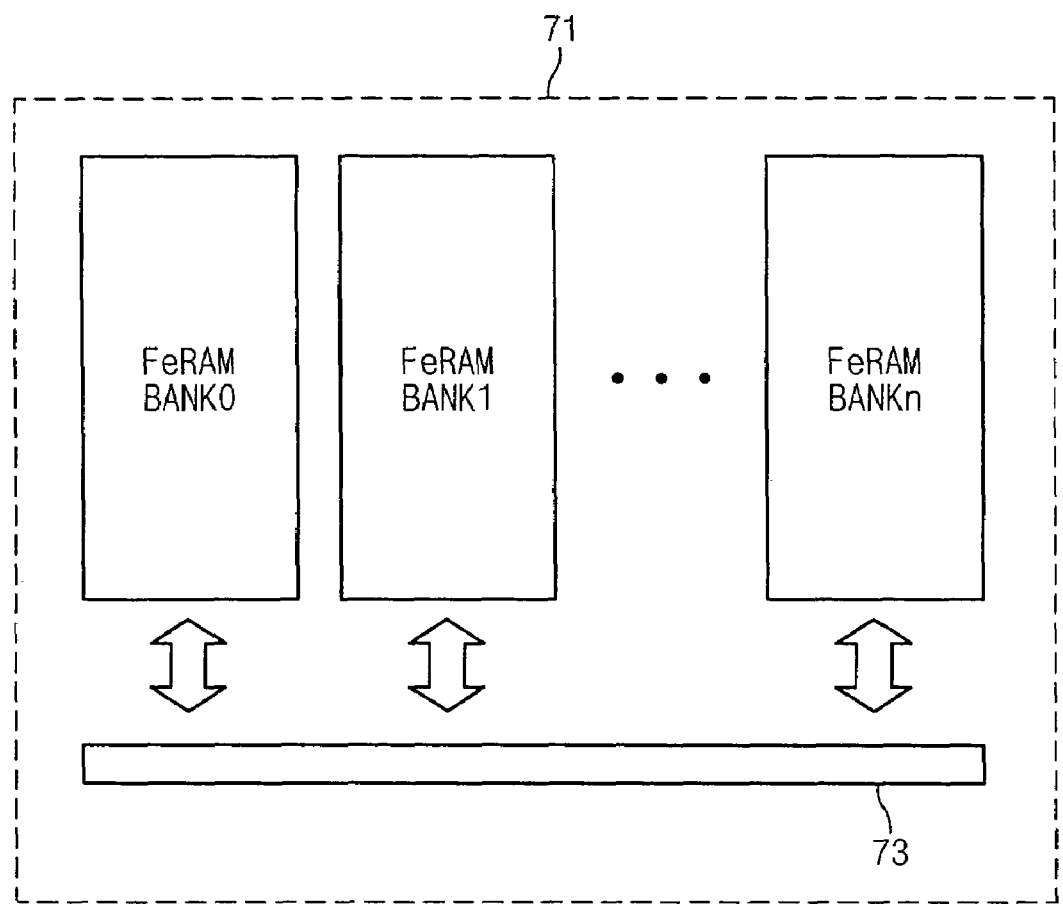

FIG. 11 is a detailed structural diagram illustrating the multi-bank 71 of FIG. 10.

The multi-bank 71 comprises a plurality of FeRAM banks. The plurality of FeRAM banks share an address/data control bus 73.

Figure 12:
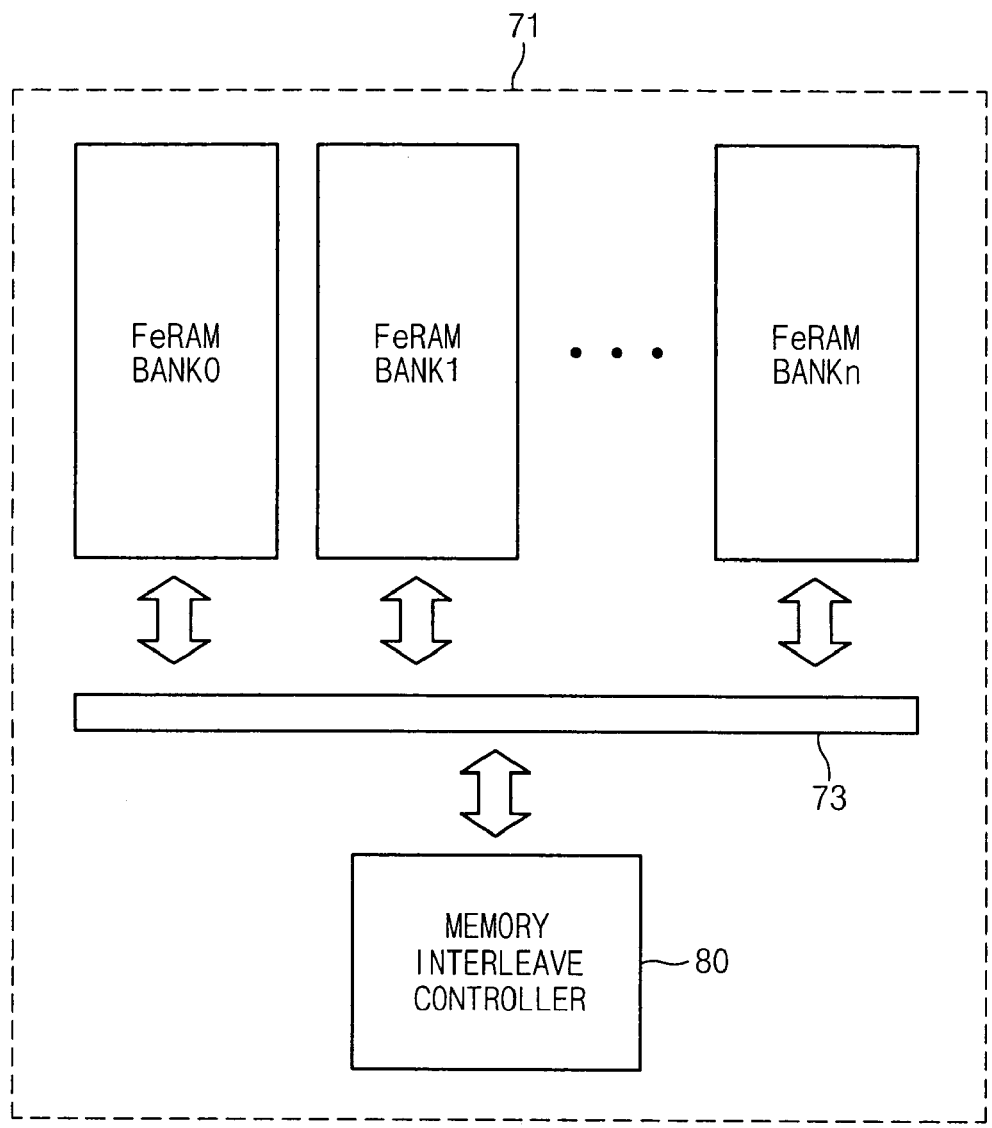

FIG. 12 is another example illustrating the multi-bank 71 of FIG. 10.

The multi-bank 71 comprises a plurality of FeRAM banks. The plurality of FeRAM banks share an address/data control bus 73. The multi-bank 71 further comprises a memory interleave controller 80 configured to individually control interleave operations of a plurality of FeRAM banks.

Figure 13:
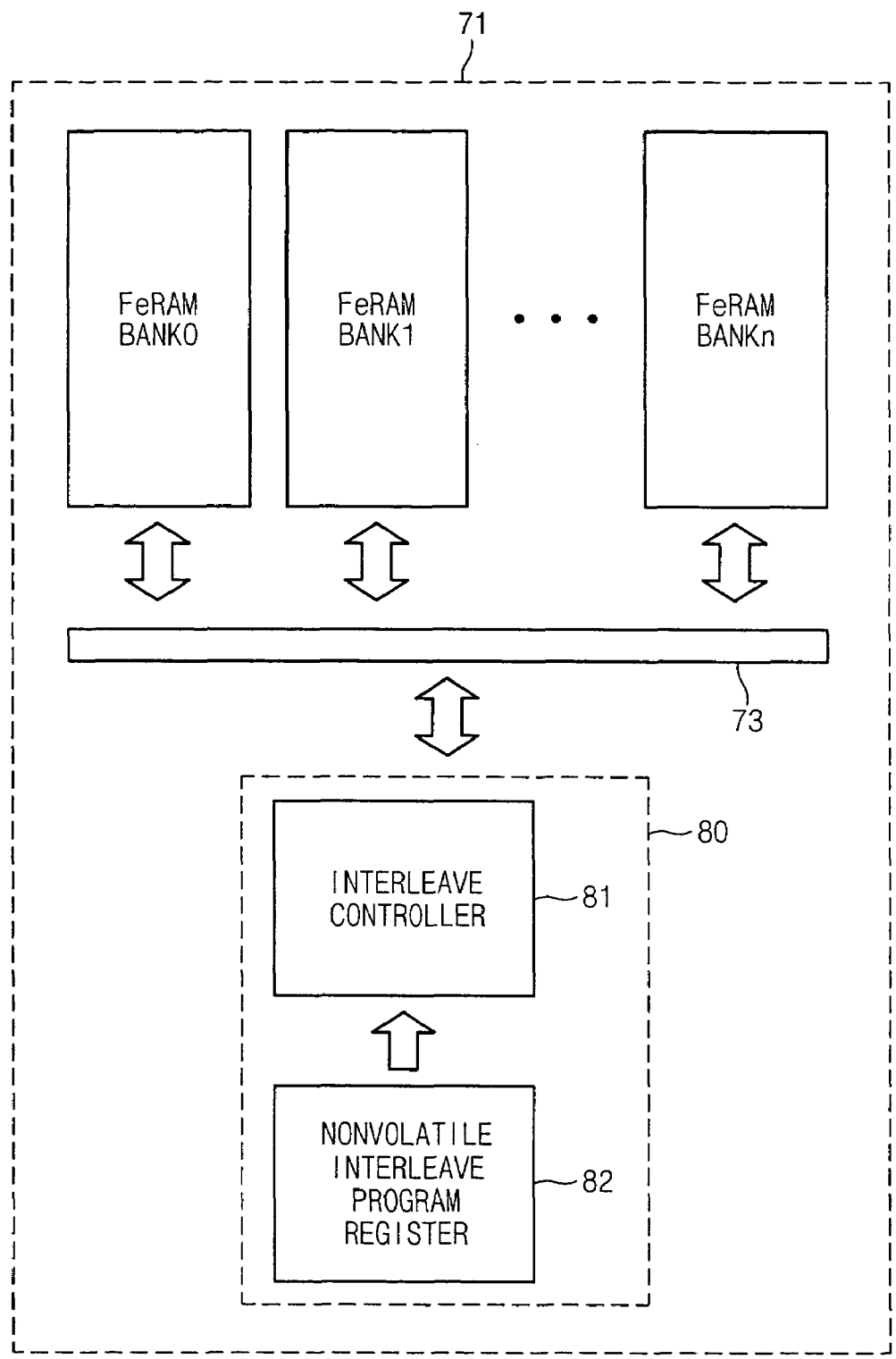

FIG. 13 is a detailed structural diagram illustrating the memory interleave controller 80 of FIG. 12.

The memory interleave controller 80 comprises an interleave controller 81 and a nonvolatile interleave program register 82.

The nonvolatile interleave program register 82 programs a code for controlling an interleave using a nonvolatile ferroelectric memory. The interleave controller 81 changes an address path of a plurality of FeRAM banks depending on the programmed code by the nonvolatile interleave program register 82.

Figure 14:
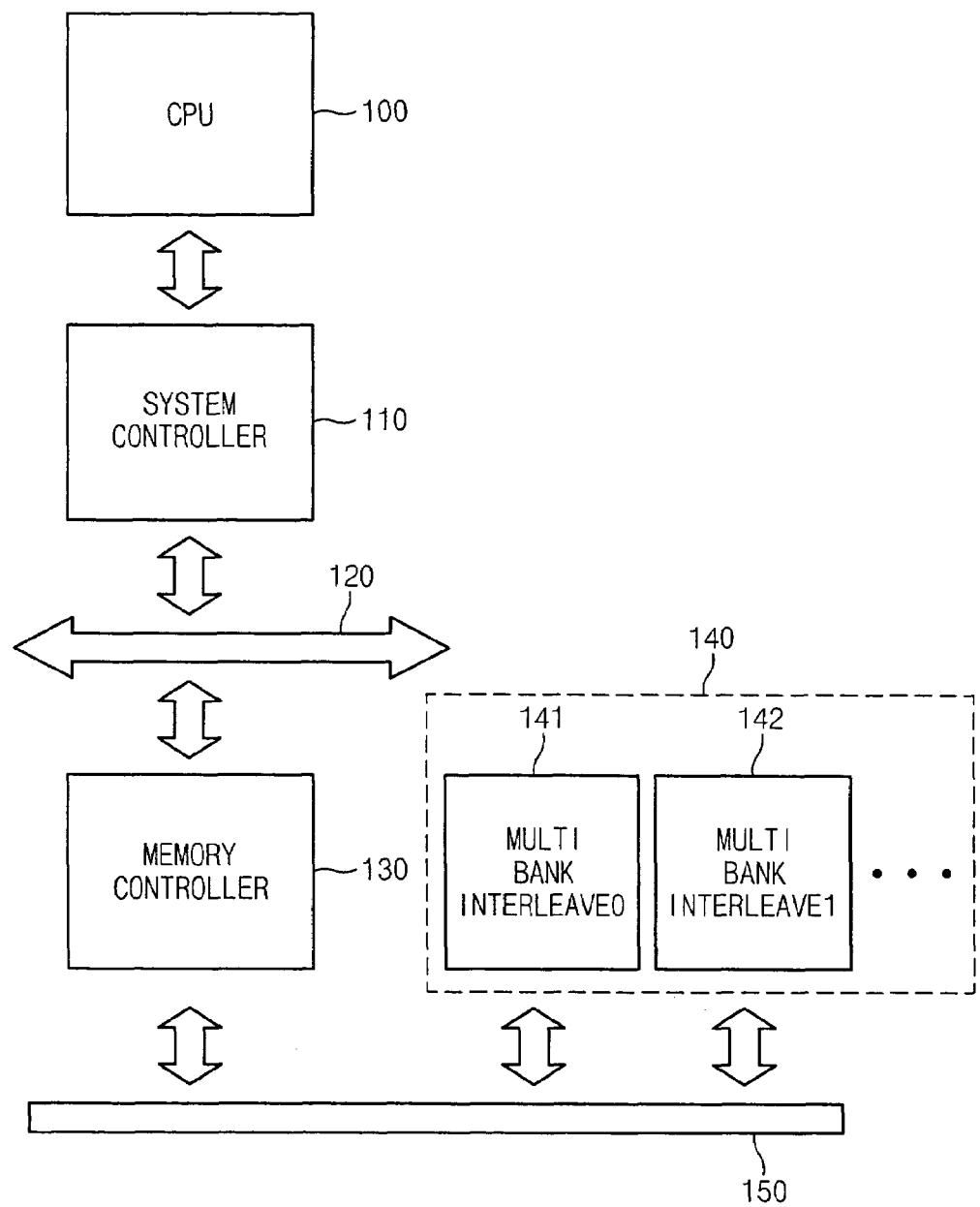

FIG. 14 is another example illustrating an interleave control device using a nonvolatile ferroelectric memory according to an embodiment of the present invention.

The interleave control device of FIG. 14 comprises a CPU 100, a system controller 110, a PCI bus 120, a memory controller 130, a multi-bank interleave FeRAM array 140 and a bus 150. The multi-bank interleave FeRAM array 140 includes a plurality of multi-bank interleaves 141 and 142.

The CPU 100 connected to the system controller 110 controls operations necessary to drive the system. The system controller 110 exchanges data with the memory controller 130 via the PCI bus 120.

The memory controller 130 exchanges data with a plurality of multi-bank interleaves 141 and 142 in the multi-bank interleave FeRAM array 140 via the address/data/control bus 150.

The memory controller 130 does not require an extra unit to embody a memory interleave. The interleave operations are controlled individually by the multi bank interleaves 141 and 142 in the multi-bank interleave FeRAM array 140.

Figure 15:
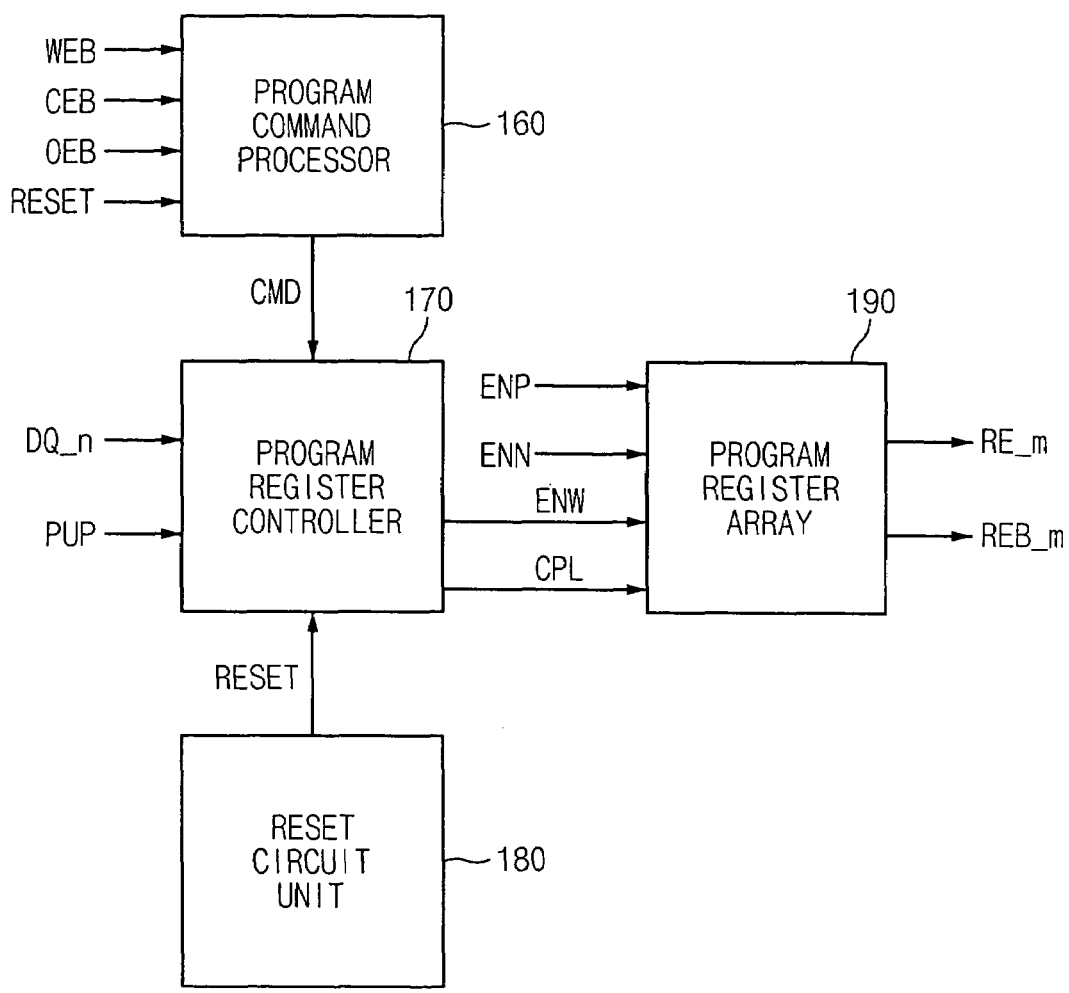
FIG. 15 is a detailed structural diagram illustrating a nonvolatile interleave program register according to an embodiment of the present invention.

FIG. 15 is a detailed structural diagram illustrating a nonvolatile interleave program register according to an embodiment of the present invention.

The nonvolatile interleave program register comprises a program command processor 160, a program register controller 170, a reset circuit unit 180 and a program register array 190.

The program command processor 160 codes a program command in response to a write enable signal WEB, a chip enable signal CEB, an output enable signal OEB and a reset signal RESET, and outputs a command signal CMD.

The program register controller 170 logically operates the command signal CMD, a power-up detecting signal PUP and input data DQ_n, and outputs a write control signal ENW and a cell plate signal CPL.

The program register array 190 outputs control signals RE_m and REB_m in response to a pull-up enable signal ENP, a pull-down enable signal ENN, a write control signal ENW and a cell plate signal CPL. In a power-up mode, the reset circuit unit 180 outputs the reset signal RESET into the program register controller 170.

If the command signal CMD is generated from the program command processor 160, the program register controller 170 changes or sets configuration data of the program register array 190.

In the power-up mode, the reset circuit unit 180 generates the reset signal RESET to activate the program register controller 170. Here, control signals outputted from the program register controller 170 are register operation signals for initializing nonvolatile data of the program register array 190.

Figure 16:
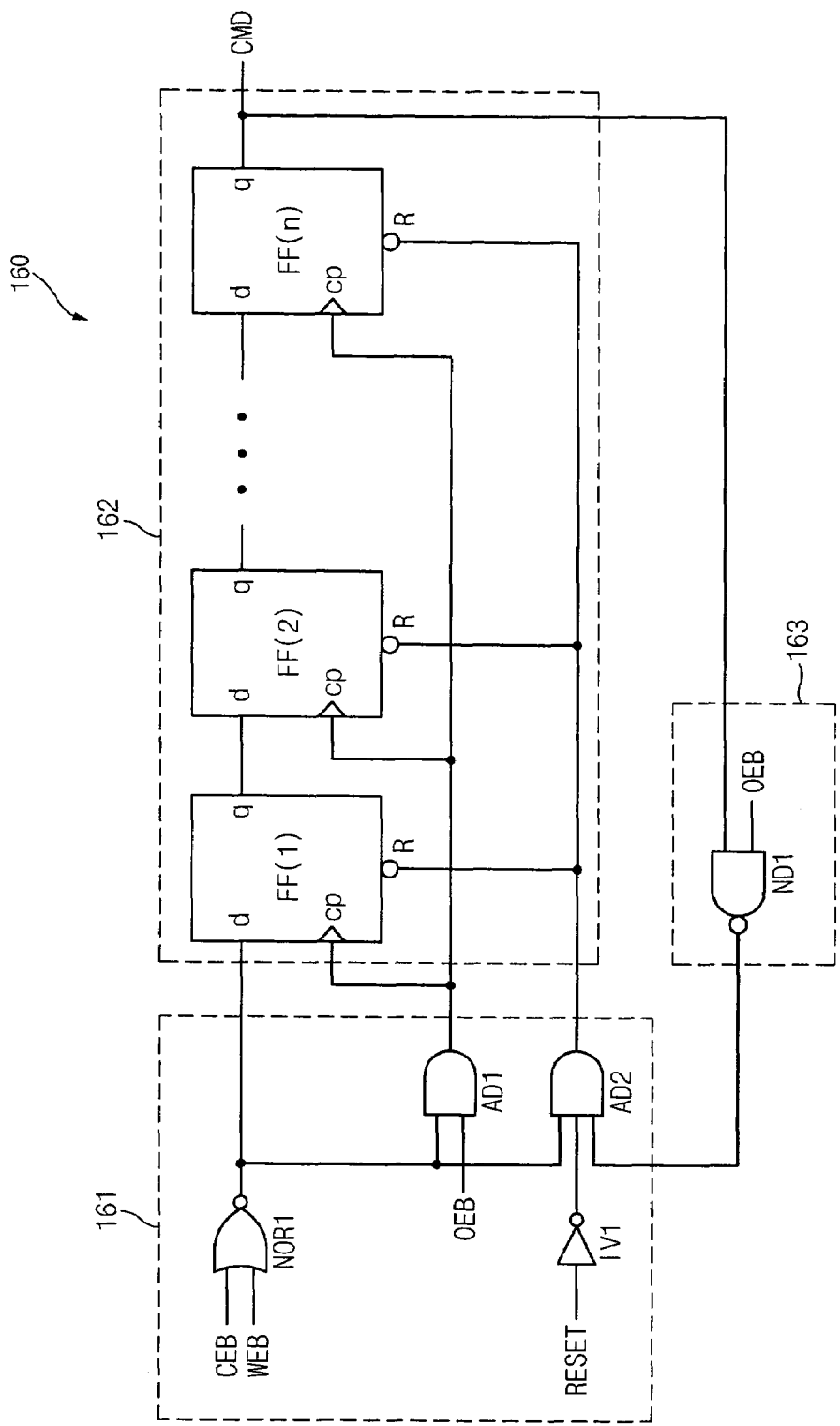
FIG. 16 is a detailed structural diagram illustrating a program command processor of FIG. 15.

FIG. 16 is a detailed structural diagram illustrating the program command processor 160 of FIG. 15.

The program command processor 160 comprises a logic unit 161, a flip-flop unit 162 and an over-toggle detector 163.

The logic unit 161 comprises a NOR gate NOR1, AND gates AD1 and AD2, and an inverter IV1. The NOR gate NOR1 performs a NOR operation on the write enable signal WEB and the chip enable signal CEB. The AND gate AD1 performs an AND operation on an output signal from the NOR gate NOR1 and the output enable signal OEB. The inverter IV1 inverts the reset signal RESET. The AND gate AD2 performs the AND operation on output signals from the NOR gate NOR1, the inverter IV1 and the over-toggle detector 163.

The flip-flop unit 162 comprises a plurality of flip-flops FF connected in series. Each flip-flop comprises a data input terminal d to receive the output signal from the NOR gate NOR1 and an output terminal q to output the command signal CMD. Each flip-flop also comprises a terminal cp to receive an activation synchronizing signal from the AND gate AD1 and a reset terminal R to receive a reset signal from the AND gate AD2.

The output enable signal OEB is inputted into the terminal cp of the flip-flop FF when the chip enable signal CEB and the write enable signal WEB are at a low level. When one of the chip enable signal CEB and the write enable signal WEB becomes at a high level, a low level signal is inputted into the reset terminal R to reset the flip-flop FF. In the power-up mode, the flip-flop FF is also reset when the reset signal RESET is at a high level.

The over-toggle detector 163 comprises a NAND gate ND1 for performing a NAND operation on the command signal CMD and the output enable signal OEB. The over-toggle detector 163 resets the flip-flop unit 162 when the output enable signal OEB over-toggles over the number n of toggles. As a result, each program command processor 160 is set to have the different number of toggles.

Figure 17:
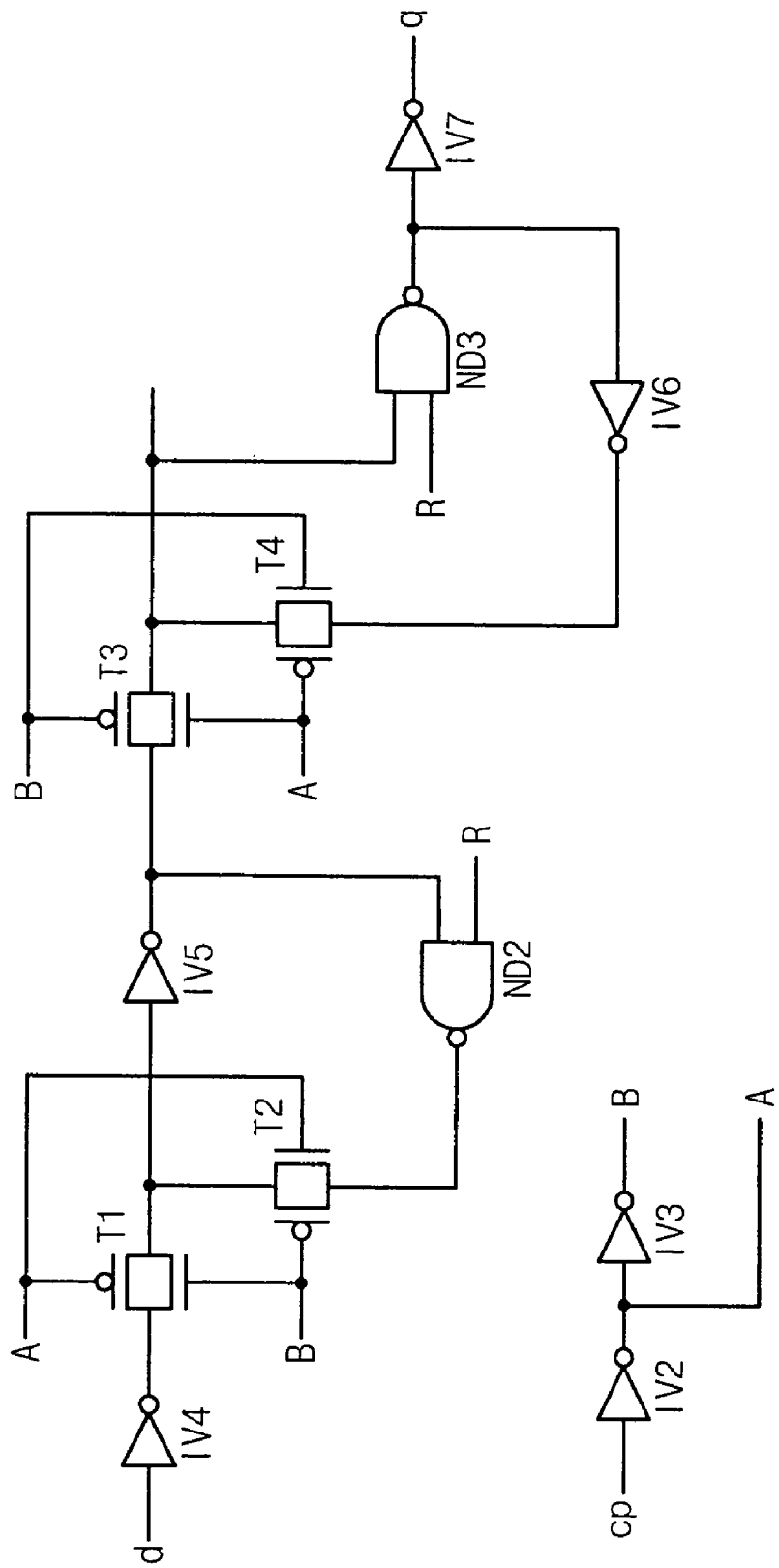
FIG. 17 is a detailed circuit diagram illustrating a flip-flop of FIG. 16.

FIG. 17 is a detailed circuit diagram illustrating the flip-flop FF of FIG. 16.

The flip-flop FF comprises transmission gates T1~T4, NAND gates ND2 and ND3, and inverters IV2~IV7. The inverter IV2 inverts an output signal from the terminal cp, and outputs a control signal A. The inverter IV3 inverts an output signal from the inverter IV2, and outputs a control signal B.

The transmission gate T1 selectively outputs an output signal from the inverter IV4 depending on states of the control signals A and B. The NAND gate ND2 performs a NAND operation on output signals from the inverter IV5 and the reset terminal R, and outputs the NAND operation result into the transmission gate T2. The transmission gate T2 selectively outputs an output signal from the NAND gate ND2 depending on the states of the control signals A and B.

The transmission gate T3 selectively outputs the output signal from the inverter IV5 depending on the states of the control signals A and B. The NAND gate ND3 performs a NAND operation on output signals from the transmission gate T3 and the reset node R. The inverter IV6 inverts an output signal from the NAND gate ND3, and outputs the inverted signal into the transmission gate T4.

The transmission gate T4 selectively outputs an output signal from the inverter IV6 depending on the states of the control signals A and B. The inverter IV7 inverts the output signal from the NAND gate ND3, and outputs the inverted signal into the output terminal q.

Data inputted from the input terminal d moves rightward whenever the control signal inputted through the terminal cp toggles. Here, when a low level signal is inputted in the reset terminal R, a low level signal is outputted from the output terminal q to reset the flip-flop FF.

Figure 18:
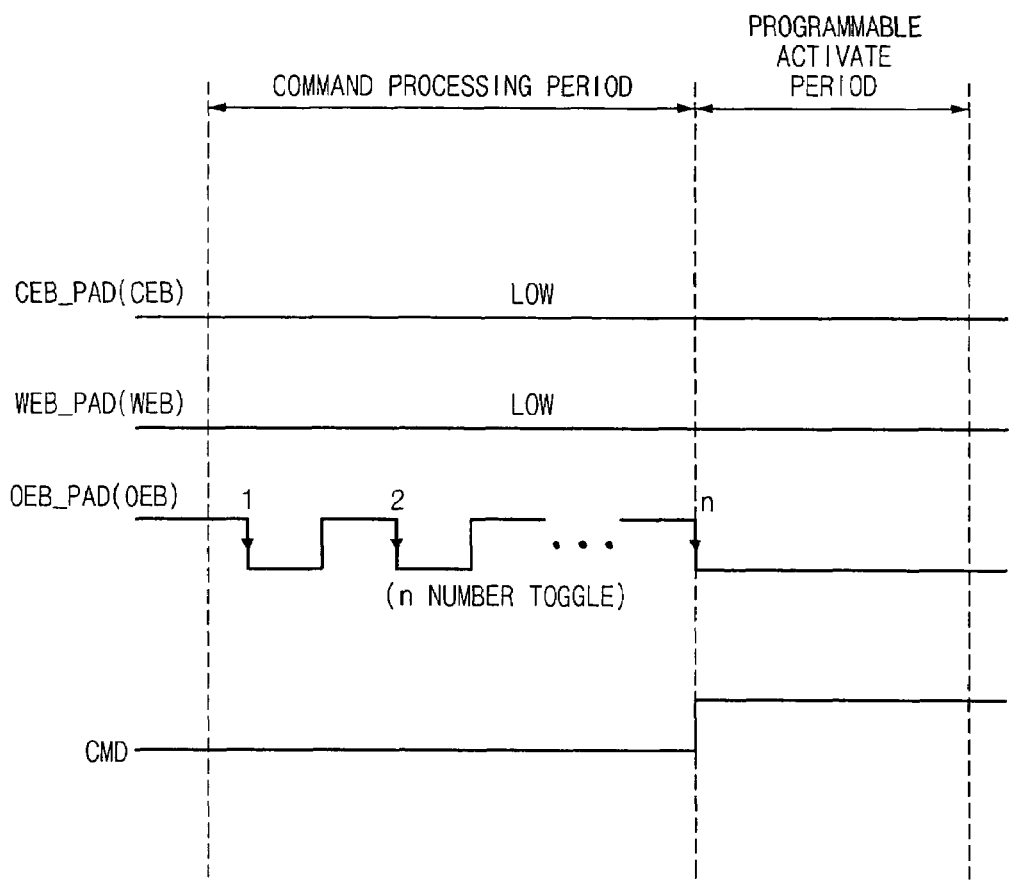
FIG. 18 is a timing diagram illustrating the operation of the program command processor of FIG. 15.

FIG. 18 is a timing diagram illustrating the operation of the program command processor 160 of FIG. 15.

In the command processing interval, the chip enable signal CEB and the write enable signal WEB are maintained at the low level. While the output enable signal OEB toggles n-times, the command signal CMD is maintained at a disable state.

Thereafter, if the output enable signal OEB toggles n-times in the programmable activation interval, the command signal CMD is enabled to the high level. Here, when the number of toggles of the output enable signal OEB is regulated, the number of flip-flops FF connected in series is also regulated.

Figure 19:
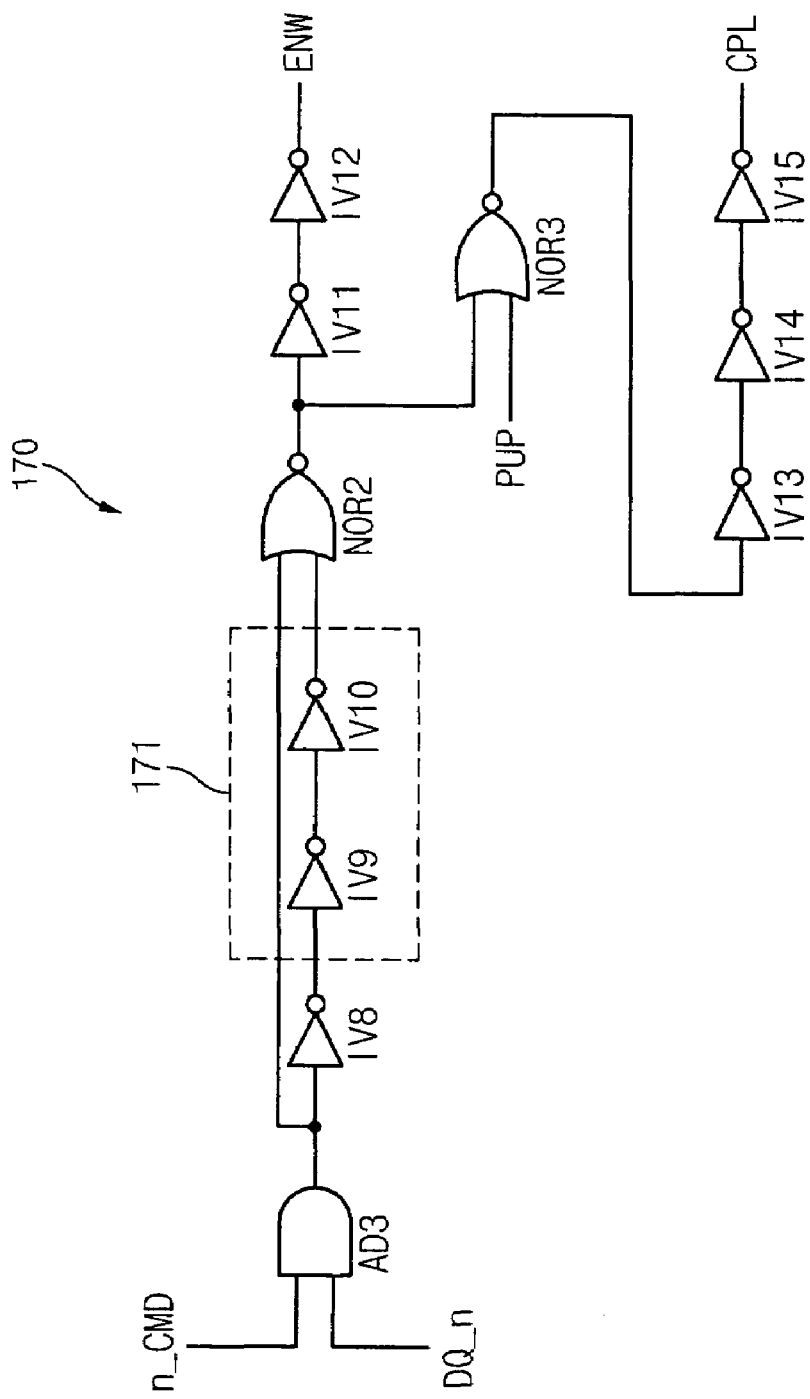
FIG. 19 is a detailed circuit diagram illustrating a program register controller of FIG. 15.

FIG. 19 is a detailed circuit diagram illustrating the program register controller 170 of FIG. 15.

The program register controller 170 comprises an AND gate AD3, an inverter IV8~IV15, and NOR gates NOR2 and NOR3.

The AND gate AD3 performs an AND operation on the $n^{th}$ command signal n_CMD and the input data DQ_n. The inverters IV8~IV10 inverts and delays an output signal from the AND gate AD3. The NOR gate NOR2 performs a NOR operation on output signals from the AND gate AD3 and the inverter IV10. The inverters IV11 and IV12 delays an output signal from the NOR gate NOR2, and outputs the write control signal ENW.

The NOR gate NOR3 performs the NOR operation on the output signal from the NOR gate NOR2 and the power-up detecting signal PUP. The inverters IV13~IV15 invert and delay an output signal from the NOR gate NOR3, and output the cell plate signal CPL. Here, the power-up detecting signal PUP is a control signal to reset the register after reading data stored in an initial reset mode After the $n^{th}$ command signal n_CMD is activated to a high level, and if the input data DQ_n toggles by using an input pad, the write control signal ENW and the cell plate signal CPL having pulse width for a delay time of the delay unit 171 are generated.

Figure 20:
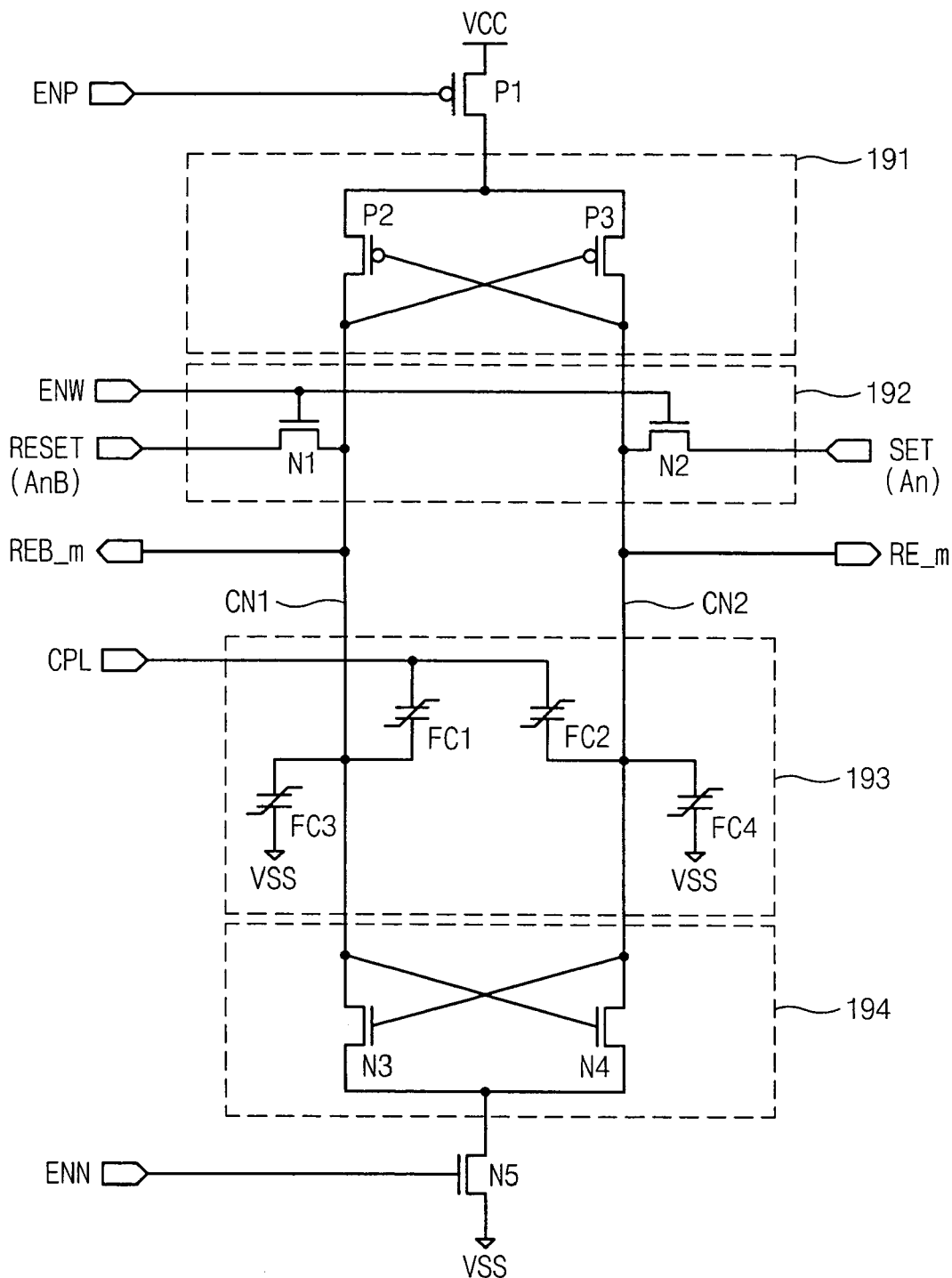
FIG. 20 is a detailed circuit diagram illustrating a program register array of FIG. 15.

FIG. 20 is a detailed circuit diagram illustrating the program register array 190 of FIG. 15.

The program register array 190 comprises a pull-up driver P1, driving units 191 and 194, a write enable controller 192, a ferroelectric capacitor unit 193, and a pull-down driver N5.

The pull-up driver P1 comprises a PMOS transistor P1, connected between power voltage terminal and driving unit 191, and having a gate to receive the pull-up enable signal ENP.

The driving unit 191 comprises PMOS transistors P2 and P3 having a latch-type. A gate of the PMOS transistor P2 is connected to a drain of the PMOS transistor P3, and a gate of the PMOS transistor P3 is connected to a drain of the PMOS transistor P2.

The write enable controller 192 comprises NMOS transistor N1 and N2. The NMOS transistor N1, connected between a reset signal RESET input terminal and a node CN1, has a gate to receive the write control signal ENW. The NMOS transistor N2, connected between a set signal SET input terminal and a node CN2, has a gate to receive the write control signal ENW.

The ferroelectric capacitor unit 193 comprises ferroelectric capacitors FC1~FC4. The ferroelectric capacitor FC1 has one terminal connected to the node CN1, and the other terminal to receive the cell plate signal CPL. The ferroelectric capacitor FC2 has one terminal connected to the node CN2, and the other terminal to receive the cell plate signal CPL.

The ferroelectric capacitor FC3 is connected between the node CN1 and the ground voltage terminal, and the ferroelectric capacitor FC4 is connected between the node CN2 and the ground voltage terminal. Here, the ferroelectric capacitors FC3 and FC4 may be selectively added depending on the control of loading levels of both ends of the cell.

The driving unit 194 comprises NMOS transistors N3 and N4 having a latch type. The NMOS transistor N3, connected between the node CN1 and a drain of a NMOS transistor N5, has a gate connected to a drain of the NMOS transistor N4. The NMOS transistor N4, connected between the node CN2 and the drain of the NMOS transistor N5, has a gate to connected to a drain of the NMOS transistor N3.

The pull-down driver N5, connected between the driving unit 194 and the ground voltage VSS terminal, has a gate to receive the pull-down enable signal.

The control signals RE_m and REB_m are outputted from output terminals of the program register array 100.

Figure 21:
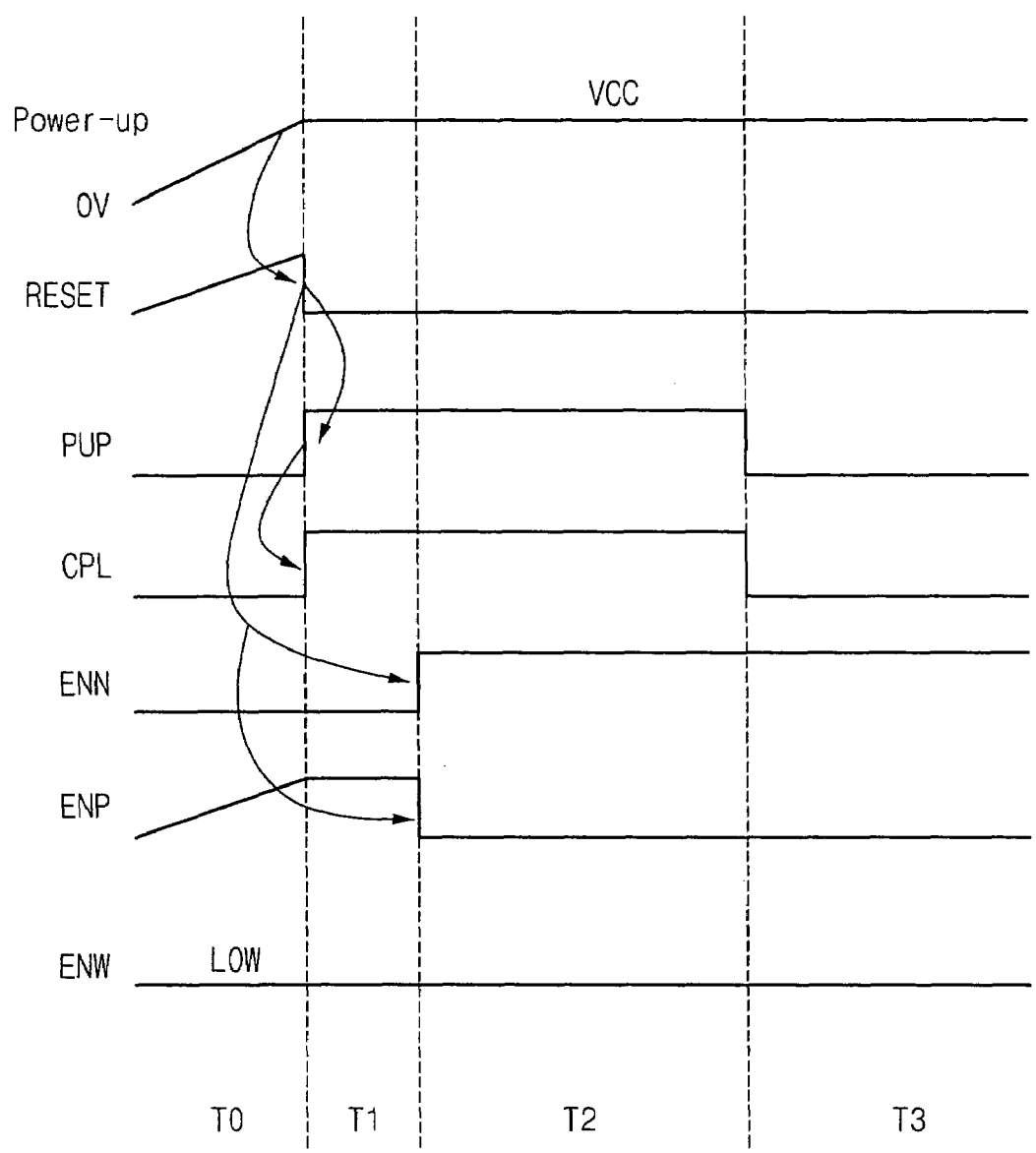
FIG. 21 is a timing diagram illustrating the operation of an interleave control device in a power-up mode according to an embodiment of the present invention.

FIG. 21 is a timing diagram illustrating the operation of the interleave control device in a power-up mode according to an embodiment of the present invention.

After the power-up operation, if a power source reaches a stable power voltage VCC level in the interval T1, the reset signal RESET is disabled, and the power-up detecting signal PUP is enabled.

Thereafter, the cell plate signal CPL transits to a high level. Charges stored in the ferroelectric capacitors FC1 and FC2 of the program register array 190 generate voltage difference between the node CN1 and CN2 by load capacitance of the ferroelectric capacitors FC3 and FC4.

When the interval T2 having enough voltage difference between the nodes CN1 and CN2 starts, the pull-down enable signal ENN is enabled to a high level. Then, the pull-up enable signal ENP is disabled to a low level to amplify data of the nodes CN1 and CN2.

Next, if data amplification of the nodes CN1 and CN2 is completed in the interval T3, the power-up detecting signal PUP and the cell plate signal CPL transit to the low level. As a result, the destroyed data of high level are restored in the ferroelectric capacitors FC1 and FC2. Here, the write control signal ENW maintained at a low level prevents external data from being re-written.

Figure 22:
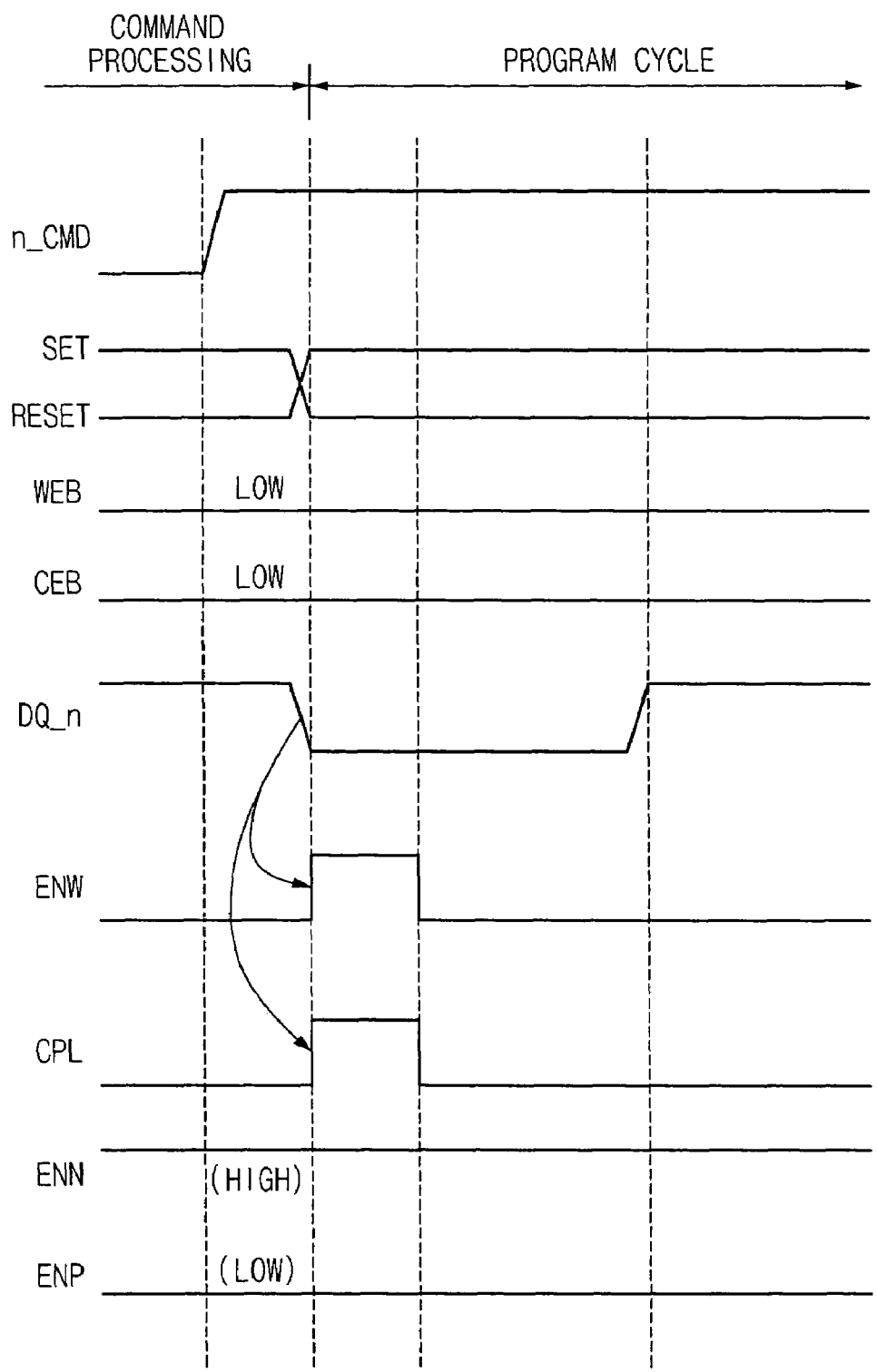
FIG. 22 is a timing diagram illustrating the operation of an interleave control device according to an embodiment of the present invention.

FIG. 22 is a timing diagram illustrating the operation of the interleave control device according to an embodiment of the present invention. The operation is to set new data in the program register after the $n^{th}$ command signal n_CMD is activated to the high level.

If a predetermined time passes after the $n^{th}$ command signal n_CMD is enabled to the high level, the set signal SET and the reset signal RESET are inputted in the program register. Then, the input data DQ_n applied from a data I/O pad is disabled from a high to low level. As a result, the program cycle starts, and the write control signal ENW to write new data in the program register and the cell plate signal CPL transit to a high level. Here, the pull-down enable signal ENN is maintained at the high level, and the pull-up enable signal ENP is maintained at the low level.

When the $n^{th}$ command signal n_CMD is inputted as the high level in the program register controller 170, the signals are prevented from being inputted/outputted in the program command processor 160. As a result, the program operation can be performed while additional control commands are not inputted in the register.

As discussed earlier, the present invention has the following effects.

First, memory interleave operations can be individually controlled depending on kinds of addresses in an embodiment of the interleave control device using a single FeRAM chip applied in an asynchronous or synchronous FeRAM.

Second, memory interleave operations can be individually controlled depending on kinds of addresses in an embodiment of the interleave control device using a multi-bank FeRAM chip applied in an asynchronous or synchronous FeRAM.

Third, memory interleave operations can be individually controlled depending on kinds of addresses in an embodiment of the interleave control device using a multi-bank interleave FeRAM chip having an interleave controller therein.

Finally, a nonvolatile ferroelectric register in a nonvolatile interleave program register prevents program data from being destroyed when power is off.

What is claimed is:

1. An interleave control device using a nonvolatile ferroelectric memory, comprising:
    a single chip FeRAM array comprising a plurality of single banks, wherein the signal chip FeRAM array controls access time differently in each address;
    a memory interleave controller including:
        a nonvolatile interleave program register configured to program a code for controlling the interleave using a nonvolatile ferroelectric memory, wherein the nonvolatile ferroelectric memory programs a code for differently controlling a memory interleave operation depending on an access latency time and a restore latency time which are set in a memory interleave region corresponding to lower address bits of row address bits, wherein the nonvolatile interleave program register includes:
            a program command processor configured to output a command signal for coding a program command in response to a write enable signal, a chip enable signal, an output enable signal and a reset signal;

a program register controller configured to logically operate the command signal, input data and a power-up detecting signal, and to output a write control signal and a cell plate signal; and a program register array, including a nonvolatile ferroelectric memory device, configured to output a programmed code signal in response to the write control signal, the cell plate signal, a pull-up enable signal and a pull-down enable signal; and an interleave controller configured to output a control signal for changing an address path of the signal chip FeRAM array depending on the programmed code by the nonvolatile interleave program register; and a bus configured to transfer data between the single chip FeRAM array and the memory interleave controller.

2. The device according to claim 1, wherein the nonvolatile interleave program register further comprises a reset circuit unit configured to output the reset signal into the program register controller in a power-up mode.

3. The device according to claim 1, wherein the program command processor comprises:

a logic unit configured to logically operate the write enable signal, the chip enable signal, the output enable signal and the reset signal;

a flip-flop unit configured to sequentially flip-flop toggles of the output enable signal in response to an output signal from the logic unit, and to output the command signal; and an over-toggle detector configured to detect over-toggles of the output enable signal.

4. The device according to claim 3, wherein the logic unit comprises:

a first NOR gate configured to perform a NOR operation on the write enable signal and the chip enable signal;

a first AND gate configured to perform an AND operation on an output signal from the first NOR gate and the output enable signal; and a second AND gate configured to perform an AND operation on an output signal from the first NOR gate, an inverted reset signal and an output signal from the over-toggle detector.

5. The device according to claim 3, wherein the over-toggle detector comprises a NAND gate configured to perform a NAND operation on the command signal and the output enable signal.

6. The device according to claim 4, wherein the program register controller comprises:

a third AND gate configured to perform an AND operation on the command signal and the input data;

a first delay unit configured to non-invert and delay an output signal from the third AND gate;

a second NOR gate configured to perform a NOR operation on output signals from the third AND gate and from the first delay unit;

a second delay unit configured to delay an output signal from the second NOR gate, and to output the write control signal;

a third NOR gate configured to perform a NOR operation on an output signal from the second NOR gate and the power-up detecting signal; and a third delay unit configured to invert and delay an output signal from the third NOR gate, and to output the cell plate signal.

7. The device according to claim 1, wherein the program register array comprises:

a pull-up driver configured to pull up a power voltage when the pull-up enable signal is enabled;

a first driving unit configured to be cross-coupled to both ends of a program register, and to driver a voltage applied from the pull-up driver;

a write enable controller configured to output the reset signal and a set signal into both ends of the program register in response to the write control signal;

a ferroelectric capacitor configured to generate voltage difference between both ends of the program register in response to the cell plate signal;

a pull-down driver configured to pull down a ground voltage when the pull-down enable signal is enabled; and a second driving unit configured to be cross-coupled to both ends of the program register, and to drive a voltage applied from the pull-down driver.

* * * * *